US009465402B2

(12) United States Patent
Kaiser

(10) Patent No.: US 9,465,402 B2
(45) Date of Patent: Oct. 11, 2016

(54) PEDAL TRAVEL TRANSDUCER AND PEDAL UNIT

(75) Inventor: Harry Kaiser, Markgroeningen (DE)

(73) Assignee: Robert Bosch GmbH, Stuttgart (DE)

(*) Notice: Subject to any disclaimer, the term of this patent is extended or adjusted under 35 U.S.C. 154(b) by 498 days.

(21) Appl. No.: 13/504,450

(22) PCT Filed: Sep. 7, 2010

(86) PCT No.: PCT/EP2010/063104
§ 371 (c)(1),
(2), (4) Date: Jul. 4, 2012

(87) PCT Pub. No.: WO2011/054562
PCT Pub. Date: May 12, 2011

(65) Prior Publication Data

US 2012/0272785 A1 Nov. 1, 2012

(30) Foreign Application Priority Data

Nov. 4, 2009 (DE) ........................ 10 2009 046 387

(51) Int. Cl.

| | |
|---|---|
| ***G01R 33/07*** | (2006.01) |
| ***G01D 5/12*** | (2006.01) |
| ***G01B 7/30*** | (2006.01) |
| ***G01B 7/00*** | (2006.01) |
| ***G05G 1/38*** | (2008.04) |

(52) U.S. Cl.
CPC ............ *G05G 1/38* (2013.01); *Y10T 74/20888* (2015.01)

(58) Field of Classification Search
CPC ...... G01R 33/07; G01R 33/02; G01R 33/09; G01R 33/098; G01R 15/202; G01D 5/145; G01D 5/12; G01D 5/2451; G01D 5/147; G01B 7/30; G01B 7/003; G01P 3/487
USPC ............................... 324/167, 207.23, 207.25
See application file for complete search history.

(56) References Cited

U.S. PATENT DOCUMENTS

| | | | | |
|---|---|---|---|---|
| 2,996,931 | A * | 8/1961 | Garafola | 74/562 |
| 4,131,006 | A * | 12/1978 | Kohl et al. | 72/67 |
| 4,649,879 | A * | 3/1987 | Hofer | F02D 1/045 123/373 |
| 5,133,321 | A * | 7/1992 | Hering et al. | 123/399 |
| RE34,302 | E | 7/1993 | Imoehl | |
| 6,019,016 | A * | 2/2000 | Takagi et al. | 74/513 |
| 6,070,490 | A | 6/2000 | Aschoff et al. | |

(Continued)

FOREIGN PATENT DOCUMENTS

| | | | |
|---|---|---|---|
| CN | 101156124 | A | 4/2008 |
| DE | 195 36 699 | A1 | 4/1997 |

(Continued)

OTHER PUBLICATIONS

International Search Report corresponding to PCT Application No. PCT/EP2010/063104, mailed Oct. 21, 2010 (German and English language document) (8 pages).

*Primary Examiner* — Arleen M Vazquez
*Assistant Examiner* — Alesa Allgood
(74) *Attorney, Agent, or Firm* — Maginot, Moore & Beck LLP

(57) ABSTRACT

A pedal travel transducer has sensors and a pedal unit which has a pedal travel transducer. The pedal travel transducer has a transducer which experiences a movement of the pedal through an elastic driver that is connected to the pedal so that the sensors register this movement.

8 Claims, 5 Drawing Sheets

(56) References Cited

U.S. PATENT DOCUMENTS

| | | | | |
|---|---|---|---|---|
| 6,298,746 | B1 * | 10/2001 | Shaw | 74/512 |
| 8,240,230 | B2 * | 8/2012 | Peniston et al. | 74/512 |
| 2003/0112003 | A1 * | 6/2003 | Pfaffenberger et al. | 324/207.2 |
| 2004/0040408 | A1 | 3/2004 | Shaw et al. | |
| 2006/0145688 | A1 * | 7/2006 | Guderzo | 324/207.2 |
| 2006/0206144 | A1 * | 9/2006 | Miersch | A61B 17/062 606/205 |
| 2008/0106873 | A1 * | 5/2008 | Okuya | 361/748 |

FOREIGN PATENT DOCUMENTS

| | | | |
|---|---|---|---|
| DE | 103 41 277 | A1 | 3/2005 |
| DE | 10 2005 033 179 | A1 | 1/2007 |
| DE | 10 2006 040 911 | A1 | 3/2007 |
| WO | 2005026861 | A2 | 3/2005 |

* cited by examiner

FIG. 6
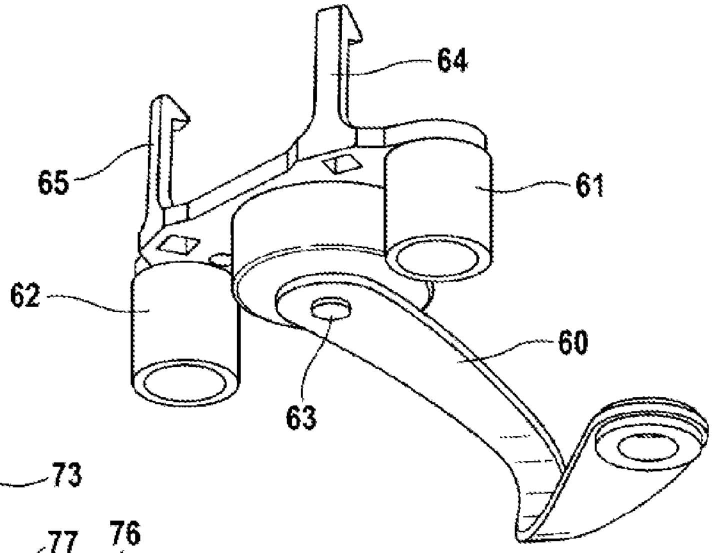
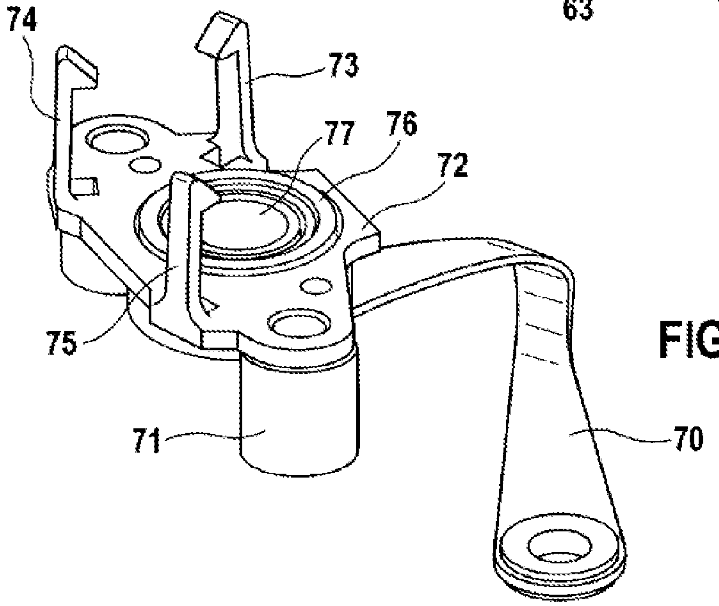
FIG. 7
FIG. 8
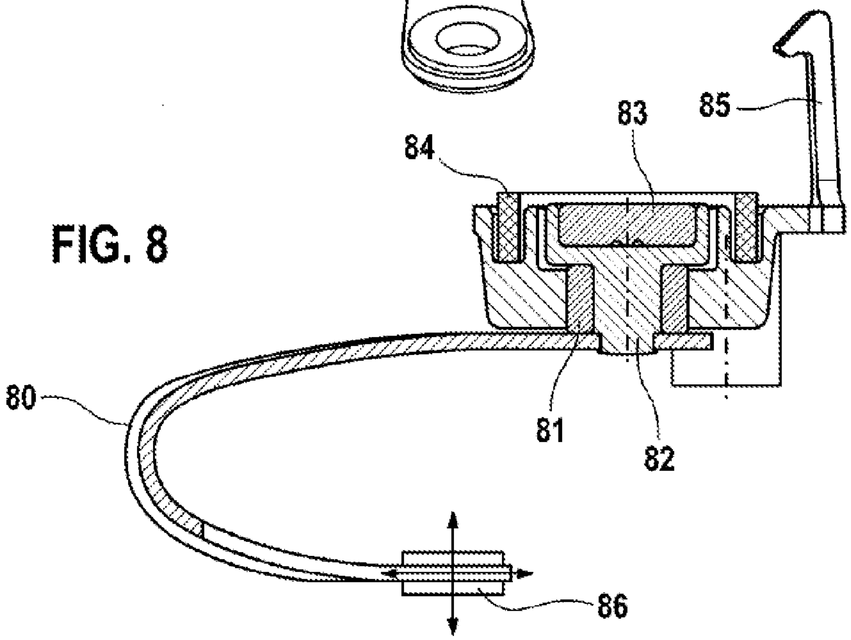

PEDAL TRAVEL TRANSDUCER AND PEDAL UNIT

This application is a 35 U.S.C. §371 National Stage Application of PCT/EP2010/063104, filed on Sep. 7, 2010, which claims the benefit of priority to Serial No. DE 10 2009 046 387.9, filed on Nov. 4, 2009 in Germany, the disclosures of which are incorporated herein by reference in their entirety.

BACKGROUND

The disclosure relates to a pedal travel transducer and to a pedal unit of the generic type.

DE 10 2005 033 179 A1 discloses that a sensor module can be accommodated in a hollow axle of a pedal module, wherein magnets are arranged around the sensor module in cutouts in the pedal unit. The magnets rotate with the pedal and therefore rotate around the sensor.

SUMMARY

The pedal travel transducer according to the disclosure or the pedal unit according to the disclosure have, compared with the above, the advantage that a transducer, for example a magnet of the pedal travel transducer, experiences a movement of the pedal via a resilient driver which can be connected to the pedal, with the result that a sensor system of the pedal travel transducer, for example a Hall sensor system, senses this movement. In particular, a brake pedal is subjected to high forces when activation occurs. The brake pedal which is rotatably mounted in the associated stable bearing block deforms elastically when activation occurs, for example in the millimeter range in all three spatial axes. In order to avoid transmitting this elastic activation deformation to the sensor system, the resilient driver is used here as a lever that can compensate several millimeters of tolerance offset. Such a resilient driver is cost-effective, has a small installation space requirement, has a low weight and does not exhibit any wear since the resilient driver accommodates movements occurring as elastic spring through deformations of the pedal. The spring steel sheet of the resilient driver transmits, for example, the rotational movement of the brake pedal to the transducer, wherein the resilient driver can compensate an offset of attachment points of the pedal travel transducer. As stated above, relatively large elastic deformations can therefore be absorbed in the millimeter range of the pedal during continuous operation.

In particular, the pedal travel transducer according to the disclosure is suitable as a pre-mounted, aligned unit which can be attached with few attachment means, for example screws, to a pedal unit and in the process to the bearing block, for example. The resilient driver is also attached here to the pedal, for example the brake pedal, for example with a screw connection.

A pedal travel transducer is understood here to be a unit which senses the travel or a rotational angle of a pedal and makes it available as an electrical signal for further processing. Such further processing can occur, for example, in a control unit configured to control vehicle movement dynamics. The pedal travel transducer is composed of a plurality of modules, at least of a sensor system, a transducer and a resilient driver. Further components of the pedal travel transducer which are not necessary to understand the disclosure and which can also be replaced by alternatives are described below.

The sensor system is configured to sense the movement of the pedal on the basis of transducer signals of the transducer. In this context, the sensor system converts this movement into an electrical signal. A wide variety of sensor principles can be applied here. One preferred variant provides that the transducer is a magnet or is composed of a plurality of magnets, and the sensor system is a magnetic sensor system, for example a Hall sensor system or magnetoresistive sensor system. All the sensor principles are optical sensors, inductive sensors, ultrasonic high-frequency sensors, radar sensors and/or other sensor principles known to a person skilled in the art. The transducer is, as stated, the counterpart to the sensor system and brings about corresponding signals through the movement of the pedal through the resilient driver, which signals can be converted into electrical signals by the sensor system.

The resilient driver is a connecting component which can be connected to the pedal and indirectly or directly transmits this movement of the pedal to the transducer, with the result that the transducer experiences this movement and then gives rise to change to sensor signals for the sensor system, which can therefore sense this movement. The driver is of resilient configuration, i.e. it has a predefined elasticity, which is in, for example, the millimeter range, in order to filter out the above-mentioned phenomena when, for example, a brake pedal is activated. The resilient driver therefore constitutes a mechanical filter configured to filter out deformations during the activation of the brake pedal. Resilient means that the driver assumes its original shape again after the end of this deformation. The resilient driver can be, for example, a piece of spring steel sheet, a spring steel, other metal compounds or composite materials which have this resilient effect. Preferred refinements can be found in the exemplary embodiments. The resilient driver can be connected, in particular, to the pedal, i.e. the resilient driver has a way of connecting which permits this attachment or connection to the pedal. For example the resilient driver can have a drilled hole in order to permit riveting or screwing to connect to the pedal. However, a clamped connection, latched connecting or other positively engaging, frictionally engaging or materially joined connections are possible here.

In the case of movement of the pedal, which may be, for example, a brake pedal, accelerator pedal, clutch pedal, a rotational movement or linear movement or a combination of the two is identified.

The term "experience" is to be understood according to the claim as meaning that owing to the movement the transducer also experiences, for example, a second movement via the resilient driver, which second movement gives rise to change to sensor signals. This second movement can be a linear movement, tilting movement or rotating movement, but it is, for example, also possible for the configuration of a structure which forms the transducer to change by parts moving with respect to one another. The term "sense" is to be understood here as meaning that the sensor system senses the transducer signals, for example a magnetic field, wherein the magnetic field has been changed owing to the movement of the transducer. This change is then sensed with the sensor system, and therefore the movement of the pedal is sensed.

A pedal unit is here the unit which is installed in the vehicle to which the pedal is mounted. The pedal unit therefore comprises a rigid part which is referred to as a bearing block and the movable pedal. According to the disclosure, the pedal travel transducer is attached to the pedal unit by the transducer being connected to the sensor system and the resilient driver being directly or indirectly connected to the bearing block or the movable pedal. Only the resilient driver is connected to the pedal, while the sensor system and the transducer are directly or indirectly connected to the bearing block. Indirectly means here that the transducer is located, for example, in a structure which ultimately has an attachment member in order, for example, to be screwed on to the bearing block. This also applies to the sensor system, wherein the structures around the transducer and the sensor system are then usually connected together to the bearing block. The pedal unit and also the pedal are, in the case of brake pedals, usually manufactured from steel, and in the case of clutches or accelerator pedals usually manufactured from plastic. The pedal is mounted to be movable about the hollow axle of the bearing block to rotate about this hollow axle.

The measures and development which are specified herein permit further improvements of the pedal travel transducer.

It is advantageous here that the resilient driver is attached to a shaft, wherein the shaft is operatively connected to the transducer. The driver is therefore connected on one side to the pedal and on the other side to the shaft, which is part of the pedal travel transducer. This shaft is then also moved, for example rotated, as a result of the movement of the pedal. The shaft is operatively connected to the transducer. This preferably means that the shaft is, for example, embodied on one side in such a way that it accommodates the transducer, for example via a beaker-like or pot-like formation in which the transducer is accommodated. On the other side, the driver is attached to the shaft, with the result that the movement of the driver acts on the transducer via the shaft. The shaft is usually manufactured from metal here, but it can also be manufactured from plastic or other materials.

The resilient driver is preferably attached to the shaft by means of what is referred to as wobble riveting. Wobble riveting is understood to be a direct riveting method for manufacturing high-quality rivet connections. The shaping process is carried out by web-shaped punctiform shaping of the closing head with the riveting die, which is inclined obliquely with respect to the axis of the rivet. The riveting die surrounds the closing head with a predefined movement over the entire circumference, which is combined with an axial approach movement. As a result, the stretch limit of the material is exceeded on a punctiform basis, with the result that the riveting material begins to flow and becomes cold-shaped. The punctiform rolling of the riveting die brings about both materially appropriate shaping of the rivet and gentle treatment of the rivet surface, which is largely retained. In the case of wobble riveting, the rivet head describes a wobbling movement on a circular path. The method of wobble riveting is based on the principle of continuously cold shaping the closing head in a punctiform fashion by reaching the flow limit. The tool experiences low specific loading despite a high shaping capacity since the sliding friction between the riveting die and the workpiece is minimized. In addition, the shaping process can be checked by monitoring the force path. In the case of wobble riveting, the riveting die is rotated continuously around the closing head, wherein the die is inclined at a constant angle with respect to the axis of the rivet. In addition, as mentioned above, an axial approach movement occurs through the riveting press. The impact point of the riveting die follows a downward inclined helix, as a result of which the material flows primarily in an axial and tangential direction.

It is also advantageous that the shaft is mounted with bearing bushes, and the transducer is accommodated in a receptacle of the shaft, and that the shaft and attachment member configured to attach the pedal travel transducer to a bearing block of a pedal unit are embodied in one piece to form one component. A sintered bearing bushing has proven an advantageous embodiment of the bearing bushing. Such sintered bearing bushings are available as a standard part. The sintered material structure allows these bushings to be saturated with oil, said bushings being able to absorb said oil and when necessary discharge it. In addition, a sintered bearing also exhibits self-lubrication and therefore provides an emergency running property.

As already described above it is possible to accommodate the transducer in a receptacle in a shaft which is embodied, for example, in the form of a pot or beaker and, for example in the case of a magnet, to bond in said magnet. The shaft and the attachment member of the pedal travel transducer can be embodied here in one piece to form a first component. That is to say, the shaft is connected, for example as a metal part and drilled holes for the screws for attaching the pedal travel transducer to the bearing block of the pedal unit, are embodied in one piece, i.e. from a metal part or plastic part.

Furthermore it is advantageous that the sensor system is arranged in a second component, wherein the second component is positioned also the first component and pre-secured. The pre-securing can be embodied, for example, in the form of at least one latching hook. The second component can usually be mainly embodied from plastic, wherein the first component accommodates, as stated, the sensor system with the sensor element and the corresponding evaluation electronics, for example an evaluation chip, as well as electrical connections for outputting the sensor signals. The electrical connections are, for example, plugs and/or sockets, but they can also be embodied in a wireless fashion. The resilient drive is advantageously, for example, a piece of sheet metal which has at least one bend to increase the spring effect. This bend can be configured here in such a way that the two limbs of the spring steel sheet are rotated with respect to one another, i.e. they do not rest one on top of the other, with the result that the installation of the resilient driver is thereby simplified. The first component can also have further elements such as an attachment with the latching hooks, whereby this attachment is riveted to the remaining first component.

The bend can be, in particular, between 0 and 90°, wherein the resilient driver can also be attached here to the pedal with a latching connection or a clamped connection.

Exemplary embodiments of the disclosure are illustrated in the drawing and explained in more detail in the following description.

BRIEF DESCRIPTION OF THE DRAWINGS

FIG. 6 shows a first perspective view of a first component of the pedal travel transducer according to the disclosure, FIG. 7 shows a second perspective view of the first component of the pedal travel transducer according to the disclosure, FIG. 8 shows a sectional illustration of the first component.

DETAILED DESCRIPTION

Figure 1:
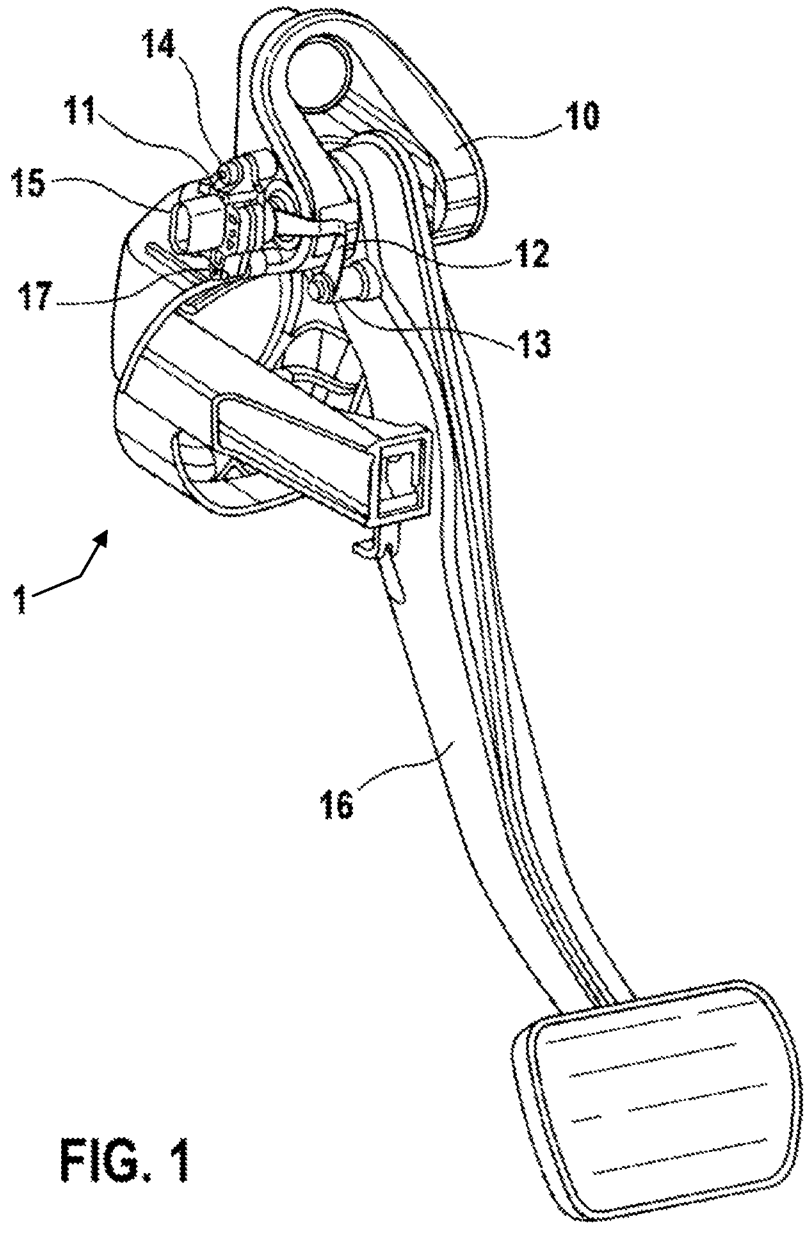
FIG. 1 shows an installed pedal unit with the pedal travel transducer according to the disclosure.

FIG. 1 shows the pedal unit 1 according to the invention with the pedal travel transducer according to the invention, wherein a pedal 16 is rotatably mounted in a bearing block 10. The pedal travel transducer 11 is screwed onto the bearing block 10 using attachment means 14 and 17. The resilient driver piece of sheet metal 12 according to the invention is screwed onto the pedal 16 by means of the screw 13. Electrical connecting means 15 serve to output the sensor signals, i.e. the signals which characterize the movement of the pedal 16.

Figure 2:
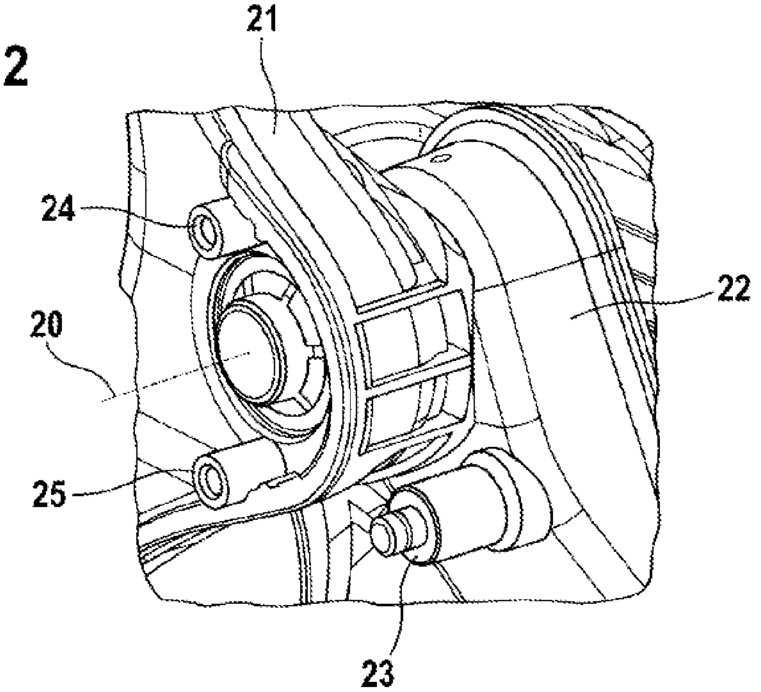
FIG. 2 shows the pedal unit without the pedal travel transducer according to the disclosure.

FIG. 2 shows a perspective illustration of part of the bearing block with the pedal 22, wherein the bearing block is denoted by 21. The pedal travel transducer 23 according to the disclosure is not illustrated here but instead only threaded sleeves 24 and attachments for the resilient driver piece of sheet metal are illustrated. The threaded sleeves 24 and 25 enable screwing the pedal travel transducer 11 to the bearing block 21. The journal 23 enables attaching the driver piece of sheet metal, for example with a latched or clamped connection. The rotational axis or hollow axle of the pedal 22 is denoted by 20 here.

Figure 3:
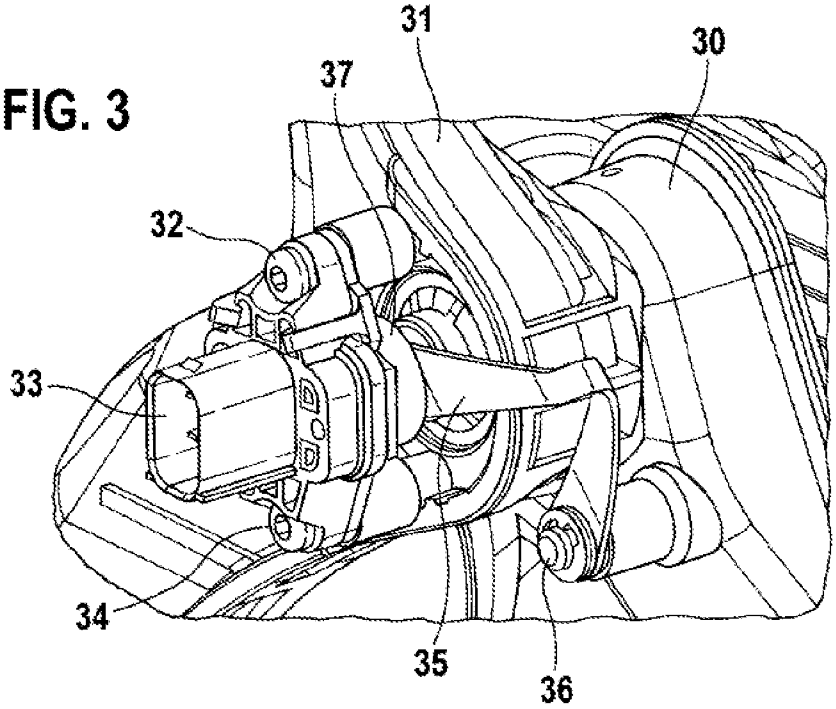
FIG. 3 shows the pedal unit with the pedal travel transducer according to the disclosure.

FIG. 3 then shows the same perspective illustration with the attached pedal travel transducer 33 according to the disclosure. The pedal is denoted by 30 and the bearing block by 31. The pedal travel transducer 33 is connected to the journal 36 using the resilient driver piece of sheet metal 35 with a latched connection. Furthermore, the resilient driver piece of sheet metal 35 is connected to a shaft 37 of the pedal travel transducer 33, which is not illustrated here. The attachment is usually carried out with what is referred to as wobble riveting to the shaft 37. The pedal travel transducer 33 is screwed onto the bearing block 31 with the screws 32 and 34, wherein the sleeves for the screws 32 and 34 of the pedal travel transducer 33 are configured to define an installation space between the pedal travel and the bearing block 31, with the result that the driver piece of sheet metal can be connected to the shaft 37 in this installation space.

If the pedal 30 then moves, the resilient driver 35 also moves due to the attachment 36, and this movement is transmitted to the shaft 37 which accommodates the transducer. This movement then leads to a changed magnetic field if the transducer is a magnet, said movement being then detected by the sensor system in the pedal travel transducer and as a result sensor signals which are changed by the changed magnetic field are output via the electrical connections, and the movement of the pedal 30 is therefore detected. This can be further processed in a control unit for controlling the vehicle movement dynamics.

Figure 4:
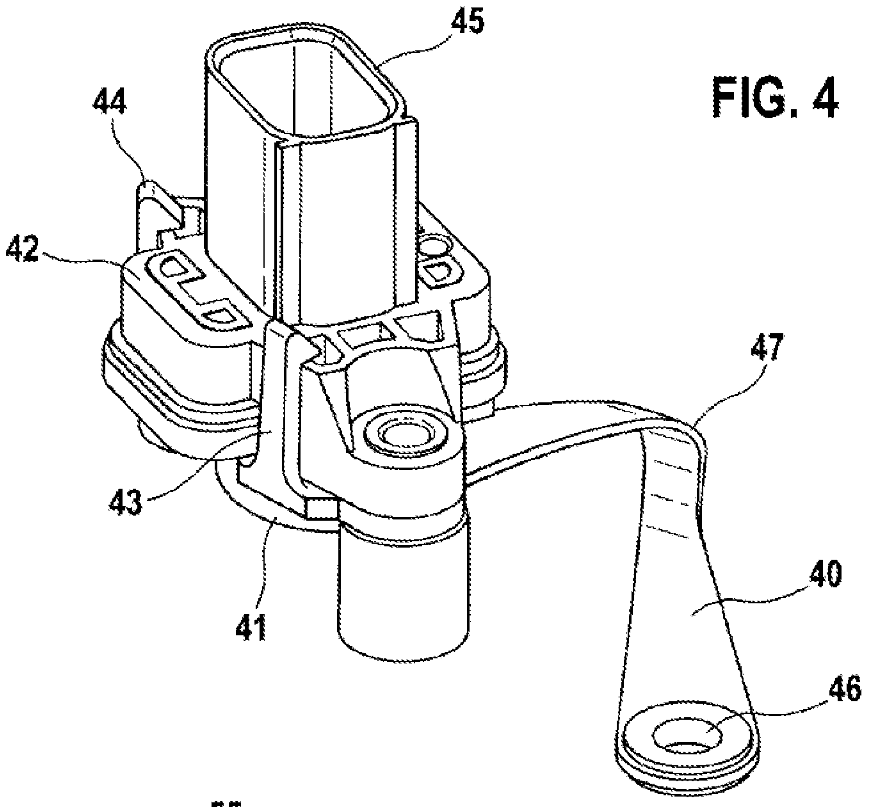
FIG. 4 shows a first perspective view of the pedal travel transducer according to the disclosure.

FIG. 4 shows a perspective illustration of the pedal travel transducer according to the disclosure. The resilient driver 40 has a bend 47 and a drilled hole 46 which enables attachment to the pedal. Alternatives to this way of attachment, are possible and are presented below explicitly. Furthermore, latching hooks 43 and 44 coupled to the first component 41, to which the driver 40 is connected, can be latched to the second component 42 in which the sensor system is located, to pre-secure the electrical connections 45. The first component 41 and the second component 42 have drilled holes which rest one on top of the other after the pre-securing, with the result that screws can be led through them to enable screwing the pedal travel transducer to the bearing block.

Figure 5:
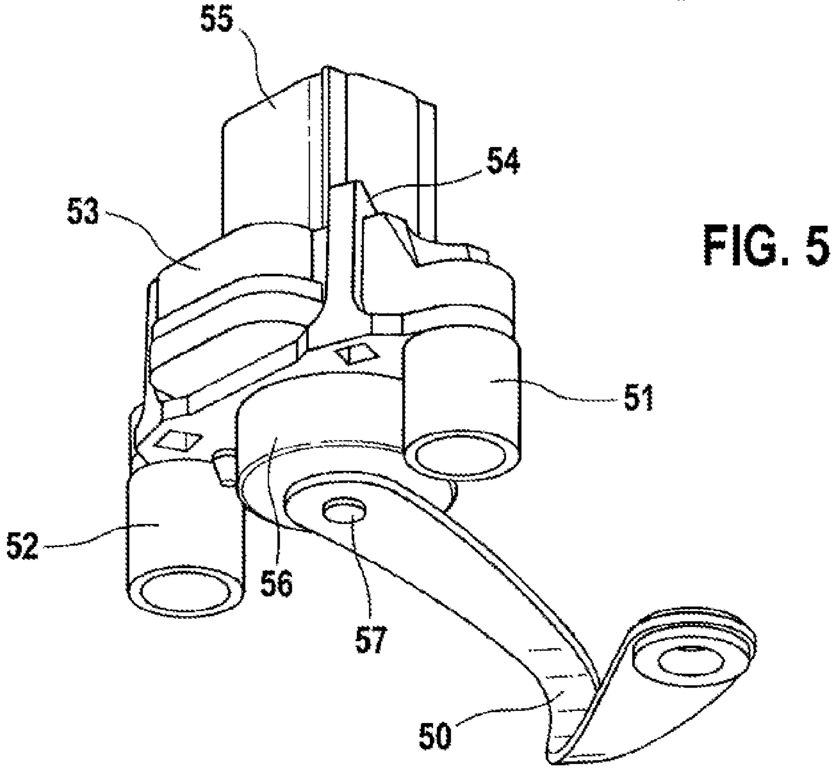
FIG. 5 shows a second perspective view of the pedal travel transducer according to the disclosure.

FIG. 5 shows this configuration in a further perspective illustration from below, with the result that the riveting 57 of the driver piece of sheet metal 50 with the lower component 56 can now be seen. The riveting occurs on the shaft, with the result that the shaft transmits the movement of the driver piece of sheet metal to the magnets which the shaft has accommodates. The drilled holes 51 and 52 define the installation space, with the result that the driver piece of sheet metal can also be riveted onto the first component 56. A further latching hook 54, which serves to pre-secure the second component 53, is illustrated. Furthermore, the electrical outputting member 55 is illustrated.

FIG. 6 shows the first component with the wobble riveting 63 of the driver piece of sheet metal 60 on the lower component, the latching hooks 64 and 65 and the drilled hole 62 and 61 for the screwed connection of the pedal travel transducer to the bearing block.

FIG. 7 shows a further perspective illustration of this first component from above. Three latching hooks 73, 74 and 75 have been used here, as well as the driver piece of sheet metal 70 which is connected to the shaft with wobble riveting. This first component is itself composed of at least two components, namely a lower part 71 and an upper part 72, which are usually connected to one another. Also illustrated is the transducer magnet 77 which is protected against foreign bodies by an annular seal 76, since this annular seal is pressed by the upper component. The annular seal 76 is preferably fabricated from rubber or another elastic material.

FIG. 8 shows a sectional illustration of the lower component. Only a latching hook 85, the rubber seal 84, the transducer magnet 83, the sintered bearings 81, the shaft 82, which is embodied in the shape of a pot, in order to accommodate the transducer magnet 83, for example by means of a bonded connection, are illustrated. The driver piece of sheet metal 80, which is attached to the shaft 82 by wobble riveting and has attachment means 86, in order to be installed on the pedal.

Figure 9:
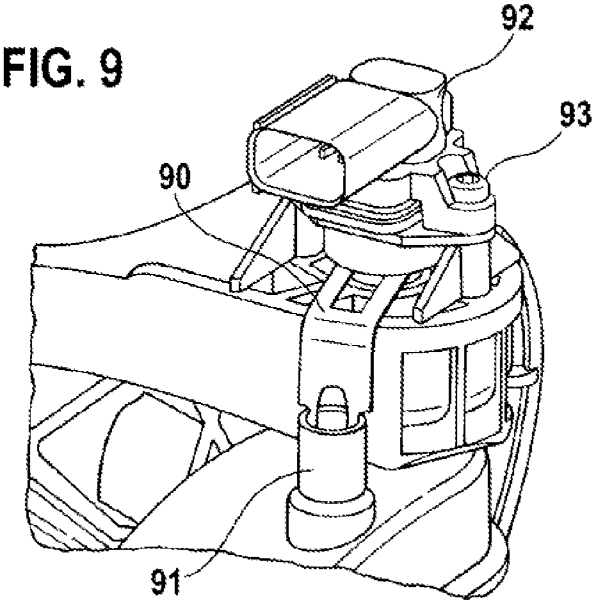
FIG. 9 shows the pedal travel transducer according to the disclosure in the installed state with a bend of 90° of the resilient driver.

FIG. 9 shows a first perspective illustration of the pedal travel transducer in an alternative embodiment. The pedal travel transducer 92 is connected to the bearing block in turn by means of the screw 93, for example. The driver piece of sheet metal 90 has here a bend through 90° and has a projection which has a breakthrough, with the result that clamping in the sleeve 91 of the pedal is possible.

Figure 10:
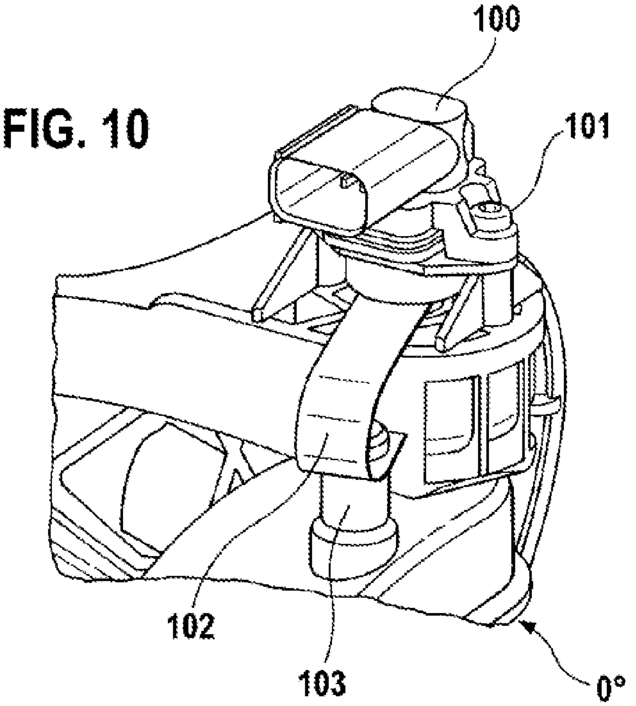
FIG. 10 shows a perspective view of the pedal travel transducer which is installed on the pedal unit 1 and has a bend of 0° of the resilient driver.

FIG. 10 shows an alternative. The pedal travel transducer 100 is now in turn connected to the bearing block with, for example, at least one screw 101, and the driver piece of sheet metal 102 is connected to the journal 103 by means of a latched connection. A bend of 0° is then present here.

Figure 11:
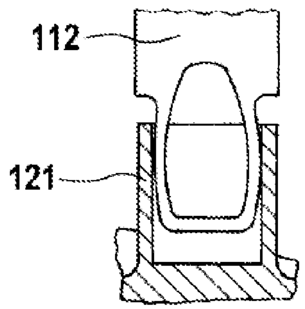
FIG. 11 shows the attachment of the resilient driver to the pedal.

FIG. 11 shows in section how the driver piece of sheet metal 112 is attached in the sleeve 121 by a clamped connection.

Figure 12:
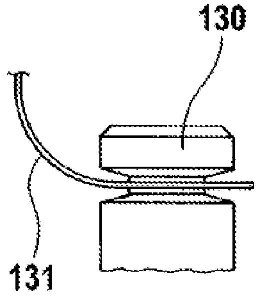
FIG. 12 shows a variant thereof.

In contrast, FIG. 12 shows how the latched connection is made to the journal 130 of the driver piece of sheet metal 131.

The invention claimed is:

1. A pedal travel transducer having a sensor system, the pedal travel transducer comprising:

- a pedal;
- a shaft;
- a resilient driver connected to the pedal, the resilient driver including an elasticity configured to compensate for deformations during activation of the pedal, wherein the resilient driver is attached to the shaft; and a transducer magnet, that experiences a movement of the pedal through the resilient driver, and that is configured to move, via the resilient driver, in response to the movement of the pedal such that the sensor system senses movement of the transducer magnet, wherein the shaft is operatively connected to the transducer magnet;

wherein the resilient driver is configured to prevent transmission of an elastic activation deformation of the pedal to the sensor system.

2. The pedal travel transducer of claim 1, the resilient driver including a bend, such that the resilient driver constitutes a mechanical filter which enables, at least in part, the elasticity of the resilient driver.

3. The pedal travel transducer of claim 1, wherein the elasticity is configured to enable the resilient driver to elastically deform during the activation of the pedal.

4. The pedal travel transducer of claim 3, wherein the resilient driver is configured to assume an un-deformed shape after activation of the pedal concludes.

5. A pedal travel transducer that is for a pedal and that has a sensor system, the pedal travel transducer comprising:

a shaft;

a resilient driver configured to connect to a pedal, the resilient driver including an elasticity configured to compensate for deformations during activation of the pedal, wherein the resilient driver is attached to the shaft; and a transducer magnet that experiences a movement of the pedal through the resilient driver, and that is configured to move, via the resilient driver, in response to the movement of the pedal such that the sensor system senses movement of the transducer magnet, wherein the shaft is operatively connected to the transducer magnet;

wherein the resilient driver is configured to prevent transmission of an elastic activation deformation of the pedal to the sensor system.

6. The pedal travel transducer of claim 5, the resilient driver including a bend, such that the resilient driver constitutes a mechanical filter which enables, at least in part, the elasticity of the resilient driver.

7. The pedal travel transducer of claim 5, wherein the elasticity is configured to enable the resilient driver to elastically deform during the activation of the pedal.

8. The pedal travel transducer of claim 7, wherein the resilient driver is configured to assume an un-deformed shape after activation of the pedal concludes.

* * * * *